United States Patent
Lee et al.

(10) Patent No.: US 12,014,938 B2
(45) Date of Patent: *Jun. 18, 2024

(54) APPARATUS AND METHOD FOR PROCESSING SUBSTRATE

(71) Applicant: SEMES CO., LTD., Chungcheongnam-do (KR)

(72) Inventors: Yong Hee Lee, Cheonan-si (KR); Young Hun Lee, Cheonan-si (KR); Jinwoo Jung, Seoul (KR); Eui Sang Lim, Cheonan-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/955,206

(22) Filed: Sep. 28, 2022

(65) Prior Publication Data

US 2023/0018637 A1    Jan. 19, 2023

Related U.S. Application Data

(60) Division of application No. 17/026,389, filed on Sep. 21, 2020, now Pat. No. 11,495,474, which is a
(Continued)

(30) Foreign Application Priority Data

Nov. 30, 2017  (KR) .................. 10-2017-0162567
Mar. 16, 2018  (KR) .................. 10-2018-0031000

(51) Int. Cl.
*H01L 21/67*    (2006.01)
*H01L 21/02*    (2006.01)
*H01L 21/687*   (2006.01)

(52) U.S. Cl.
CPC .. *H01L 21/67051* (2013.01); *H01L 21/02057* (2013.01); *H01L 21/02101* (2013.01);
(Continued)

(58) Field of Classification Search
CPC ......... H01L 21/67051; H01L 21/02101; H01L 21/02057; H01L 21/67034; H01L 21/6704;
(Continued)

(56) References Cited

U.S. PATENT DOCUMENTS

2008/0314870 A1    12/2008  Inoue et al.
2013/0025155 A1*   1/2013  Kim .................. H01L 21/67028
                                                    34/516

(Continued)

FOREIGN PATENT DOCUMENTS

CN    103377971 A      10/2013
KR    20160019606    *  2/2016
KR    20170046490 A     5/2017

OTHER PUBLICATIONS

China Patent Office, Office action issued on Oct. 26, 2023.

*Primary Examiner* — Mikhail Kornakov
*Assistant Examiner* — Richard Z. Zhang
(74) *Attorney, Agent, or Firm* — Li & Cai Intellectual Property (USA) Office

(57) ABSTRACT

Disclosed is a method for processing a substrate, comprising a liquid processing step of performing liquid processing on the substrate by supplying a processing liquid onto the substrate in a liquid processing chamber, a transfer step of transferring the substrate from the liquid processing chamber to a drying chamber, and a drying step of drying the substrate in the drying chamber. In the drying step, the substrate is dried while an edge region of the substrate other than a central region of the substrate is supported by a
(Continued)

support unit, and in the liquid processing step, the liquid processing is performed on the substrate such that a height of the processing liquid remaining on the edge region of the substrate is greater than a height of the processing liquid remaining on the central region of the substrate when the liquid processing is completed in the liquid processing chamber.

7 Claims, 13 Drawing Sheets

Related U.S. Application Data continuation of application No. 16/197,458, filed on Nov. 21, 2018, now abandoned.

(52) U.S. Cl.
CPC .. *H01L 21/67028* (2013.01); *H01L 21/67034* (2013.01); *H01L 21/6715* (2013.01); *H01L 21/68707* (2013.01); *H01L 21/68764* (2013.01); *H01L 21/6719* (2013.01)

(58) Field of Classification Search
CPC ....... H01L 21/02041–02074; H01L 21/00–86; H01L 21/67028–67057; B05D 1/005
See application file for complete search history.

(56) References Cited

U.S. PATENT DOCUMENTS

| | | | |
|---|---|---|---|
| 2015/0279708 A1* | 10/2015 | Kobayashi | H01L 21/67028 438/747 |
| 2016/0184870 A1* | 6/2016 | Miura | H01L 21/02065 134/33 |
| 2016/0372320 A1* | 12/2016 | Emoto | H01L 21/02057 |
| 2017/0301534 A1* | 10/2017 | Nakamori | H01L 21/02057 |

* cited by examiner $h_3 < h_1 < h_2$ $h_3 < h_5 < h_4 < h_2$ $h_5 < h_6 < h_4$

APPARATUS AND METHOD FOR PROCESSING SUBSTRATE

CROSS-REFERENCE TO RELATED APPLICATIONS

This application is a divisional application of U.S. application Ser. No. 17/026,389, filed on Sep. 21, 2020, and entitled "APPARATUS AND METHOD FOR PROCESSING SUBSTRATE", now pending, which is a continuation application of U.S. patent application Ser. No. 16/197,458, filed on Nov. 21, 2018, and entitled "APPARATUS AND METHOD FOR PROCESSING SUBSTRATE", now abandoned. The entire contents of which are hereby incorporated by reference.

BACKGROUND

Embodiments of the inventive concept described herein relate to an apparatus and method for processing a substrate, and more particularly, relate to an apparatus and method for processing a substrate with a liquid supplied onto the substrate and then removing the liquid.

Semiconductor processes comprise a process of cleaning a thin film, foreign matter, particles, or the like on a substrate. The cleaning process is performed by placing the substrate on a spin head such that a pattern face is directed upward or downward, supplying a processing liquid onto the substrate while rotating the spin head, and drying the substrate.

Recently, a supercritical fluid is used in a process of cleaning a substrate. For example, a liquid processing chamber for performing liquid processing on a substrate by supplying a processing liquid onto a substrate and a drying chamber for removing the processing liquid from the substrate by using a supercritical fluid after the liquid processing are provided, and the substrate completely processed in the liquid processing chamber is transferred into the drying chamber by a transfer robot.

FIG. 17 is a view illustrating a drying chamber 1000 for drying a substrate W using a supercritical fluid. The drying chamber 1000 has a support unit 1200 therein, which supports the substrate W. The support unit 1200 supports an edge region of the bottom side of the substrate W.

When a processing liquid is removed from the substrate W, it is preferable that all the processing liquid be removed from the entire region of the substrate W by the supercritical fluid. If the processing liquid on the substrate W is removed by natural drying or heating rather than the supercritical fluid, a leaning phenomenon arises in which patterns lean as shown by "A" of FIG. 18.

When the substrate W is placed on the support unit 1200 to remove the processing liquid on the substrate W by using the drying chamber 1000 with the structure illustrated in FIG. 17, the substrate W sags in the middle as illustrated in FIG. 19. Due to the sagging of the substrate W, part of the processing liquid remaining on the edge region of the substrate W flows toward the central region of the substrate W. In this case, the thickness of the processing liquid on the edge region of the substrate W is decreased, and the edge region of the substrate W is naturally dried before the supercritical fluid is supplied. Furthermore, since a large amount of processing liquid has to be removed from the central region of the substrate W, it takes a significant amount of time to dry the processing liquid. These problems grow bigger with an increase in the diameter of the substrate W.

The drying chamber 1000 is heated such that the fluid supplied into the drying chamber 1000 to remove the processing fluid is maintained in a supercritical state. In this case, the temperatures of structures, such as outer walls of the drying chamber 1000 and the support unit 1200, are higher than the temperature in the inner space of the drying chamber 1000. Therefore, a larger amount of processing liquid is evaporated by the heating from the edge region of the substrate W brought into contact with the support unit 1200, and the edge region of the substrate W is likely to be dried by the heating or naturally dried.

In addition, even when a substrate W, the entire bottom side of which is supported, is dried using a supercritical fluid, the following problems are encountered. When removing a processing liquid from the substrate W by drying the substrate W after processing the substrate W with the processing liquid, it takes a large amount of time to dry the substrate W in the case where a large amount of processing liquid remains on the substrate W. If the substrate W is processed using a small amount of processing liquid to reduce drying time, a liquid remaining on the substrate W is not sufficiently replaced with the processing liquid.

SUMMARY

Embodiments of the inventive concept provide a substrate processing apparatus and method for improving drying efficiency when drying a substrate using a supercritical fluid.

Furthermore, embodiments of the inventive concept provide a substrate processing apparatus and method for preventing an edge region of a substrate from being naturally dried.

Moreover, embodiments of the inventive concept provide a substrate processing apparatus and method for preventing a large amount of time from being taken to remove a processing liquid when drying a substrate.

In addition, embodiments of the inventive concept provide a substrate processing apparatus and method for adjusting a level of a processing liquid remaining on a substrate to a set level when the substrate is transferred into a drying chamber from a liquid processing chamber.

Aspects of the inventive concept are not limited thereto, and any other aspects not mentioned herein will be clearly understood from the following description by those skilled in the art to which the inventive concept pertains.

According to an aspect of an embodiment, a method for processing a substrate comprises a liquid processing step of performing liquid processing on the substrate by supplying a processing liquid onto the substrate in a liquid processing chamber, a transfer step of transferring the substrate from the liquid processing chamber to a drying chamber, and a drying step of drying the substrate in the drying chamber. In the drying step, the substrate is dried while an edge region of the substrate other than a central region of the substrate is supported by a support unit, and in the liquid processing step, the liquid processing is performed on the substrate such that a height of the processing liquid remaining on the edge region of the substrate is higher than a height of the processing liquid remaining on the central region of the substrate when the liquid processing is completed in the liquid processing chamber.

According to an embodiment, the liquid processing step may comprise a liquid supply step in which the substrate is rotated and the processing liquid is supplied toward the substrate and a liquid level adjustment step in which the substrate is rotated and the supply of the processing liquid is stopped after the liquid supply step.

According to an embodiment, the substrate may be rotated at a first speed in the liquid supply step and at a second speed in the liquid level adjustment step, and the second speed may be lower than the first speed.

According to an embodiment, the liquid supply step may comprise a first supply step in which the substrate is rotated at a first rotating speed and the processing liquid is supplied toward the substrate at a first flow rate and a second supply step in which the substrate is rotated at a second rotating speed and the processing liquid is supplied toward the substrate at a second flow rate. The first rotating speed may be higher than the second rotating speed, and the first flow rate may be greater than the second flow rate.

According to an embodiment, in the liquid processing step, a central nozzle and an edge nozzle may simultaneously supply the processing liquid onto the substrate. The central nozzle may supply the processing liquid onto the central region of the rotating substrate, and the edge nozzle may supply the processing liquid onto the edge region of the rotating substrate. A flow rate of the processing liquid supplied by the edge nozzle may be greater than a flow rate of the processing liquid supplied by the central nozzle.

According to an embodiment, in the liquid processing step, the processing liquid may be supplied onto the rotating substrate through a liquid supply nozzle. A dispensing location of the processing liquid supplied from the liquid supply nozzle may be moved between the central region and the edge region of the substrate. A flow rate of the processing liquid supplied onto the edge region of the substrate may be modified to be greater than a flow rate of the processing liquid supplied onto the central region of the substrate.

According to an embodiment, in the liquid processing step, the substrate may be processed by sequentially supplying a first liquid, a second liquid, and a third liquid onto the substrate, and the processing liquid may be the third liquid. In the drying step, the substrate may be dried using a supercritical fluid. The third liquid may dissolve better in the supercritical fluid than the second fluid.

According to an embodiment, the third liquid may comprise isopropyl alcohol, and the supercritical fluid may be carbon dioxide.

According to an embodiment, the substrate may be transferred into the drying chamber, with the processing liquid remaining on the substrate.

According to an embodiment, the first liquid may be an etching fluid, and the second liquid may neutralize the first liquid and may dissolve better in the third liquid than the first liquid.

According to an embodiment, the height of the processing liquid on the edge region of the substrate may be higher than the height of the processing liquid on the central region of the substrate when the substrate is transferred into the drying chamber.

According to an embodiment, the second speed may range from 10 RPM to 100 RPM.

According to an embodiment, the first speed may be 200 RPM or more.

According to another aspect of an embodiment, an apparatus for processing a substrate comprises a liquid processing chamber that performs liquid processing on the substrate by supplying a processing liquid onto the substrate, a drying chamber that removes the processing liquid from the substrate, a transfer unit that transfers the substrate between the liquid processing chamber and the drying chamber, and a controller that controls the liquid processing chamber, the drying chamber, and the transfer unit. The liquid processing chamber comprises a cup having a processing space inside, a support unit that supports and rotate the substrate in the processing space, and a liquid supply unit that supplies the processing liquid onto the substrate. The drying chamber comprises a body having an inner space inside, a support that supports an edge region of the substrate in the inner space, a fluid supply unit that supplies a fluid for drying into the inner space, and an exhaust unit that exhausts the fluid in the inner space. The controller controls the liquid processing chamber, the drying chamber, and the transfer unit to sequentially perform a liquid processing step of performing liquid processing on the substrate by supplying the processing liquid onto the substrate in the liquid processing chamber, a transfer step of transferring the substrate from the liquid processing chamber to the drying chamber, and a drying step of drying the substrate in the drying chamber and to allow a height of the processing liquid remaining on the edge region of the substrate to be higher than a height of the processing liquid remaining on a central region of the substrate when the liquid processing is completed in the liquid processing chamber in the liquid processing step.

According to an embodiment, the controller may control the liquid processing chamber such that the liquid processing step comprises a liquid supply step in which the substrate is rotated and the processing liquid is supplied toward the substrate and a liquid level adjustment step in which the substrate is rotated and the supply of the processing liquid is stopped after the liquid supply step.

According to an embodiment, the controller may control the liquid processing chamber such that a rotating speed of the substrate in the liquid supply step is higher than a rotating speed of the substrate in the liquid level adjustment step.

According to an embodiment, the liquid supply unit may comprise a central nozzle that supplies the processing liquid onto the central region of the substrate and an edge nozzle that supplies the processing liquid onto the edge region of the substrate. The controller may control the liquid processing chamber such that in the liquid supply step, the edge nozzle supplies the processing liquid onto the edge region of the rotating substrate at the same time that the central nozzle supplies the processing liquid onto the central region of the rotating substrate, and a flow rate of the processing liquid supplied by the edge nozzle is greater than a flow rate of the processing liquid supplied by the central nozzle.

According to an embodiment, in the liquid processing step, the substrate may be processed by sequentially supplying a first liquid, a second liquid, and a third liquid onto the substrate, and the processing liquid may be the third liquid. In the drying step, the substrate may be dried using a supercritical fluid. The third liquid may dissolve better in the supercritical fluid than the second fluid. The substrate may be transferred into the drying chamber, with the processing liquid remaining on the substrate.

According to another aspect of an embodiment, a method for processing a substrate comprises a liquid processing process of performing liquid processing on the substrate by supplying a processing liquid onto the substrate in a liquid processing chamber, a liquid level adjustment process of adjusting a level of the processing liquid remaining on the substrate after the liquid processing process, and a drying process of removing the processing liquid from the substrate. The liquid level adjustment process is performed by rotating the substrate while the supply of the processing liquid onto the substrate is stopped.

According to an embodiment, in the liquid level adjustment process, the level of the processing liquid remaining on the substrate may be adjusted by controlling a rotating speed of the substrate.

According to an embodiment, the rotating speed of the substrate in the liquid level adjustment process may be a first set speed when the level of the processing liquid on the substrate that is set before the drying process is a first level, and the rotating speed of the substrate in the liquid level adjustment process may be a second set speed when the level of the processing liquid on the substrate that is set before the drying process is a second level. The first level may be higher than the second level, and the first set speed may be lower than the second set speed.

According to an embodiment, the liquid processing process and the liquid level adjustment process may be performed in the liquid processing chamber, and the drying process may be performed in a drying chamber. The substrate on which the liquid level adjustment process is completely performed in the liquid processing chamber may be transferred into the drying chamber by a transfer robot.

According to an embodiment, the rotating speed of the substrate in the liquid level adjustment process may be lower than that of the substrate in the liquid processing process.

According to an embodiment, in the liquid processing process, the substrate may be processed by sequentially supplying a first liquid, a second liquid, and a third liquid onto the substrate, and the processing liquid may be the third liquid. In the drying step, the substrate may be dried using a supercritical fluid. The third liquid may dissolve better in the supercritical fluid than the second fluid.

According to an embodiment, a height of the processing liquid on an edge region of the substrate may be higher than a height of the processing liquid on a central region of the substrate when the substrate is transferred into the drying chamber.

According to an embodiment of the inventive concept, drying efficiency may be improved when a substrate is dried using a supercritical fluid.

Furthermore, according to an embodiment of the inventive concept, an edge region of a substrate may be prevented from being naturally dried when the substrate is dried.

Moreover, according to an embodiment of the inventive concept, it is possible to prevent a large amount of time from being taken to remove a processing liquid when drying a substrate.

In addition, according to an embodiment of the inventive concept, a level of a processing liquid remaining on a substrate when the substrate is transferred into a drying chamber from a liquid processing chamber may be set to a set level, thereby improving drying efficiency.

Effects of the inventive concept are not limited to the above-described effects, and any other effects not mentioned herein may be clearly understood from this specification and the accompanying drawings by those skilled in the art to which the inventive concept pertains.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
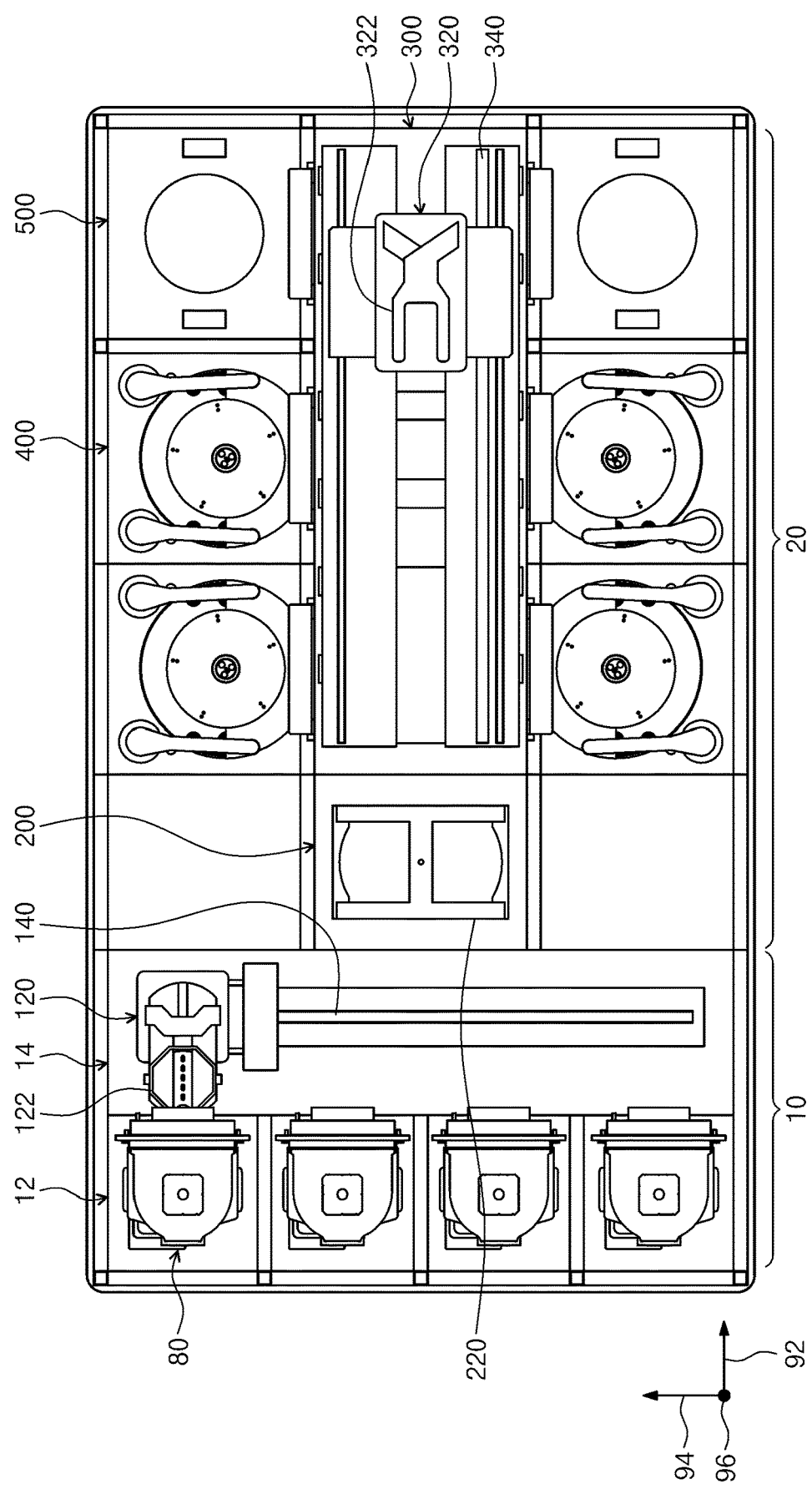
FIG. 1 is a schematic plan view illustrating a substrate processing apparatus according to an embodiment of the inventive concept.

Hereinafter, embodiments of the inventive concept will be described in more detail with reference to the accompanying drawings. The inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art. In the drawings, the dimensions of elements are exaggerated for clarity of illustration.

FIG. 1 is a schematic plan view illustrating a substrate processing apparatus according to an embodiment of the inventive concept.

Referring to FIG. 1, the substrate processing apparatus may comprise an index module 10, a processing module 20, and a controller (not shown). According to an embodiment, the index module 10 and the processing module 20 may be arranged in one direction. Hereinafter, the direction in which the index module 10 and the processing module 20 are arranged may be referred to as a first direction 92, a direction perpendicular to the first direction 92 when viewed from above may be referred to as a second direction 94, and a direction perpendicular to both the first direction 92 and the second direction 94 may be referred to as a third direction 96.

The index module 10 may transfer substrates W in containers 80 to the processing module 20 and may place the substrates W completely processed in the processing module 20 in the containers 80. The longitudinal direction of the index module 10 may be oriented in the second direction 94. The index module 10 may have a plurality of load ports 12 and an index frame 14. The load ports 12 may be located on the opposite side to the processing module 20 with respect to the index frame 14. The containers 80 having the substrates W received therein may be placed on the load ports 12. The plurality of load ports 12 may be arranged along the second direction 94.

Airtight containers, such as front open unified pods (FOUPs), may be used as the containers 80. The containers 80 may be placed on the load ports 12 by a transfer means (not illustrated), such as an overhead transfer, an overhead conveyor, or an automatic guided vehicle, or a worker.

The index frame 14 may have an index robot 120 inside. A guide rail 140 may be provided in the index frame 14. The longitudinal direction of the guide rail 140 may be oriented in the second direction 94. The index robot 120 may be provided on the guide rail 140 so as to be movable along the guide rail 140. The index robot 120 may comprise a plurality of hands 122 on which the substrates W are placed. The hands 122 may move forward or backward, may rotate about an axis oriented in the third direction 96, or may move along the third direction 96. The plurality of hands 122 may be spaced apart from each other in the vertical direction and may independently move forward or backward.

The processing module 20 may comprise a buffer unit 200, a transfer chamber 300, liquid processing chambers 400, and drying chambers 500. The buffer unit 200 may provide a space in which substrates W to be loaded into the processing module 20 and substrates W unloaded from the processing module 20 temporarily stay. The liquid processing chambers 400 may perform liquid processing on a substrate W by supplying a liquid onto the substrate W. The drying chambers 500 may remove the liquid remaining on the substrate W. The transfer chamber 300 transfers substrates W between the buffer unit 200, the liquid processing chambers 400, and the drying chambers 500.

The transfer chamber 300 may be arranged such that the longitudinal direction thereof is oriented in the first direction 92. The buffer unit 200 may be disposed between the index module 10 and the transfer chamber 300. The liquid processing chambers 400 and the drying chambers 500 may be disposed on lateral sides of the transfer chamber 300. The liquid processing chambers 400 and the transfer chamber 300 may be arranged along the second direction 94. The drying chambers 500 and the transfer chamber 300 may be arranged along the second direction 94. The buffer unit 200 may be located at one end of the transfer chamber 300.

According to an embodiment, the liquid processing chambers 400 may be disposed on the opposite lateral sides of the transfer chamber 300. The drying chambers 500 may be disposed on the opposite lateral sides of the transfer chamber 300. The liquid processing chambers 400 may be disposed to be closer to the buffer unit 200 than the drying chambers 500. The liquid processing chambers 400 may be arranged in an A×B array (A and B being natural numbers of 1 or larger) on one lateral side of the transfer chamber 300 along the first and third directions 92 and 96. Furthermore, the drying chambers 500 may be arranged in a C×D array (C and D being natural numbers of 1 or larger) on the one lateral side of the transfer chamber 300 along the first and third directions 92 and 96. Alternatively, only the liquid processing chambers 400 may be arranged on the one lateral side of the transfer chamber 300, and the drying chambers 500 may be arranged on the opposite lateral side of the transfer chamber 300.

The transfer chamber 300 may have a transfer robot 320 inside. A guide rail 340 may be provided in the transfer chamber 300. The longitudinal direction of the guide rail 340 may be oriented in the first direction 92. The transfer robot 320 may be provided on the guide rail 340 so as to be movable along the guide rail 340. The transfer robot 320 may comprise a plurality of hands 322 on which substrates W are placed. The hands 322 may move forward or backward, may rotate about an axis oriented in the third direction 96, or may move along the third direction 96. The plurality of hands 322 may be spaced apart from each other in the vertical direction and may independently move forward or backward.

The buffer unit 200 may comprise a plurality of buffers 220 in which substrates W are placed. The buffers 220 may be spaced apart from each other along the third direction 96. The buffer unit 200 may be open at the front side and the rear side thereof. The front side may face the index module 10, and the rear side may face the transfer chamber 300. The index robot 120 may approach the buffer unit 200 through the open front side thereof, and the transfer robot 320 may approach the buffer unit 200 through the open rear side thereof.

Figure 2:
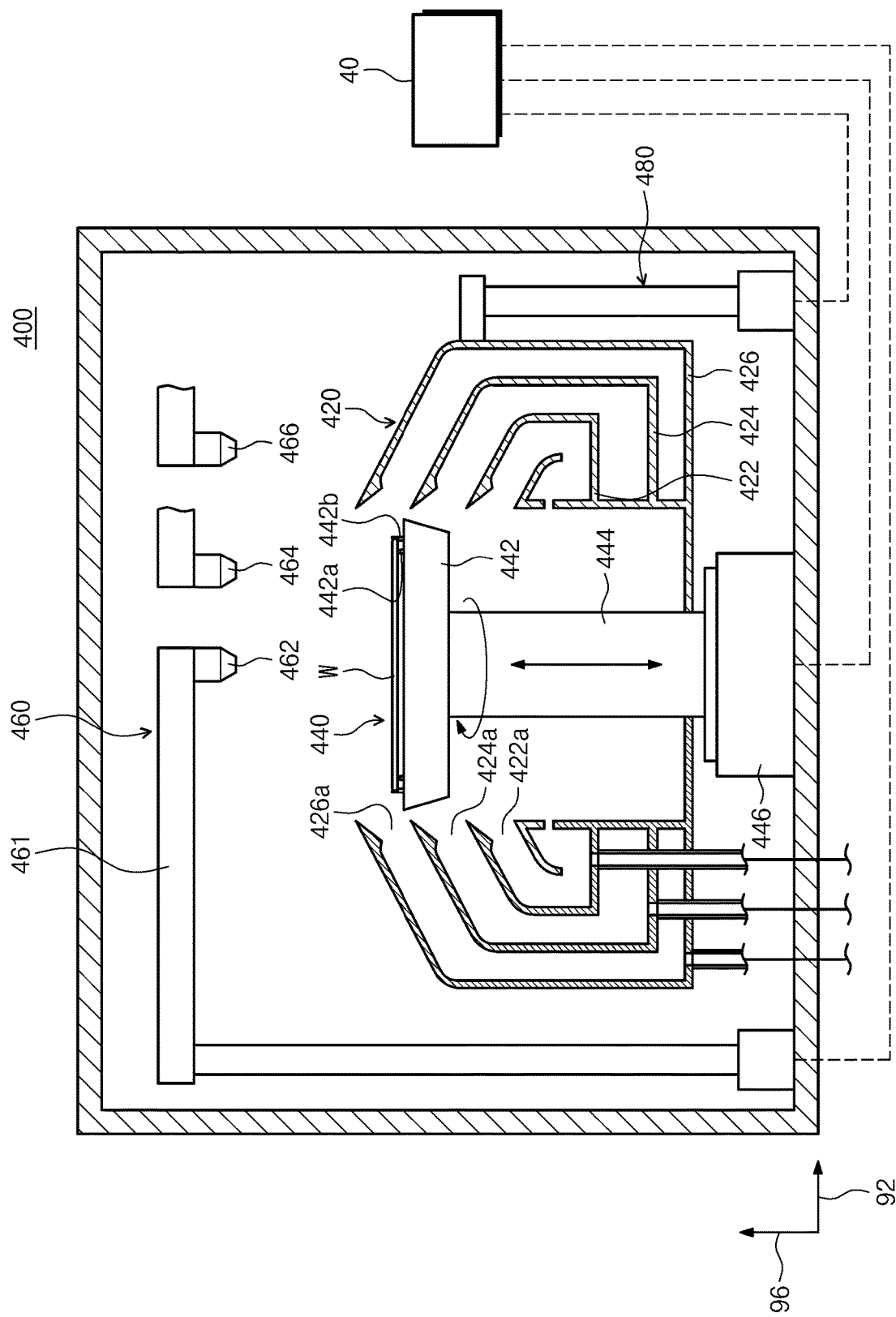
FIG. 2 is a schematic view illustrating a liquid processing chamber of FIG. 1 according to an embodiment of the inventive concept.

FIG. 2 is a schematic view illustrating the liquid processing chamber 400 of FIG. 1 according to an embodiment of the inventive concept. Referring to FIG. 2, the liquid processing chamber 400 may have a housing 410, a cup 420, a support unit 440, a liquid supply unit 460, and a lifting unit 480. The housing 410 may have a substantially rectangular parallelepiped shape. The cup 420, the support unit 440, and the liquid supply unit 460 may be disposed inside the housing 410.

The cup 420 may have a processing space that is open at the top, and a substrate W may be processed with liquids in the processing space. The support unit 440 may support the substrate W in the processing space. The liquid supply unit 460 may supply the liquids onto the substrate W supported on the support unit 440. The liquids may be sequentially supplied onto the substrate W. The lifting unit 480 may adjust the height of the cup 420 relative to the support unit 440.

According to an embodiment, the cup 420 may have a plurality of collection bowls 422, 424, and 426. The collection bowls 422, 424, and 426 may have collection spaces for collecting the liquids used to process the substrate W, respectively. Each of the collection bowls 422, 424, and 426 may have a ring shape surrounding the support unit 440. The processing liquids scattered by rotation of the substrate W during liquid processing may be introduced into the collection spaces through inlets 422a, 424a, and 426a of the respective collection bowls 422, 424, and 426. According to an embodiment, the cup 420 may have the first collection bowl 422, the second collection bowl 424, and the third collection bowl 426. The first collection bowl 422 may be disposed to surround the support unit 440, the second collection bowl 424 may be disposed to surround the first collection bowl 422, and the third collection bowl 426 may be disposed to surround the second collection bowl 424. The second inlet 424a through which a liquid is introduced into the second collection bowl 424 may be located above the first inlet 422a through which a liquid is introduced into the first collection bowl 422. The third inlet 426a through which a liquid is introduced into the third collection bowl 426 may be located above the second inlet 424a.

The support unit 440 may have a support plate 442 and a driving shaft 444. The top side of the support plate 442 may have a substantially circular shape and may have a larger diameter than the substrate W. Support pins 442a may be provided on the central portion of the support plate 442 to support the bottom side of the substrate W. The support pins 442a may protrude upward from the support plate 442 such that the substrate W is spaced apart from the support plate 442 by a predetermined distance. Chuck pins 442b may be provided on the edge portion of the support plate 442. The chuck pins 442b may protrude upward from the support plate 442 and may support the lateral portion of the substrate W to prevent the substrate W from being separated from the support unit 440 when being rotated. The driving shaft 444 may be driven by an actuator 446. The driving shaft 444 may be connected to the center of the bottom side of the support plate 442 and may allow the support plate 442 to rotate about its axis.

According to an embodiment, the liquid supply unit 460 may have a first nozzle 462, a second nozzle 464, and a third nozzle 466. The first nozzle 462 may supply a first liquid onto the substrate W. The first liquid may be a liquid for removing a film or foreign matter remaining on the substrate W. The second nozzle 464 may supply a second liquid onto the substrate W. The second liquid may be a liquid that dissolves well in a third liquid. For example, the second liquid may be a liquid that dissolves better in the third liquid than the first liquid. The second liquid may be a liquid that neutralizes the first liquid supplied onto the substrate W. Furthermore, the second liquid may be a liquid that neutralizes the first liquid and dissolves better in the third liquid than the first liquid. According to an embodiment, the second liquid may be water. The third nozzle 466 may supply the third liquid onto the substrate W. The third liquid may be a liquid that dissolves well in a supercritical fluid that is used in the drying chambers 500. For example, the third liquid may be a liquid that dissolves better in the supercritical fluid used in the drying chambers 500 than the second liquid. According to an embodiment, the third liquid may be an organic solvent. The organic solvent may be isopropyl alcohol. The first nozzle 462, the second nozzle 464, and the third nozzle 466 may be supported by different arms 461. The arms 461 may be independently moved. Alternatively, the first nozzle 462, the second nozzle 464, and the third nozzle 466 may be mounted on and simultaneously moved by the same arm.

The lifting unit 480 may vertically move the cup 420. The height of the cup 420 relative to the substrate W may be modified by the vertical movement of the cup 420. Accordingly, the collection bowls 422, 424, and 426 for collecting the processing liquids may be changed depending on the types of liquids supplied onto the substrate W, thereby separately collecting the liquids. Alternatively, the cup 420 may be fixed, and the lifting unit 480 may vertically move the support unit 440.

Figure 3:
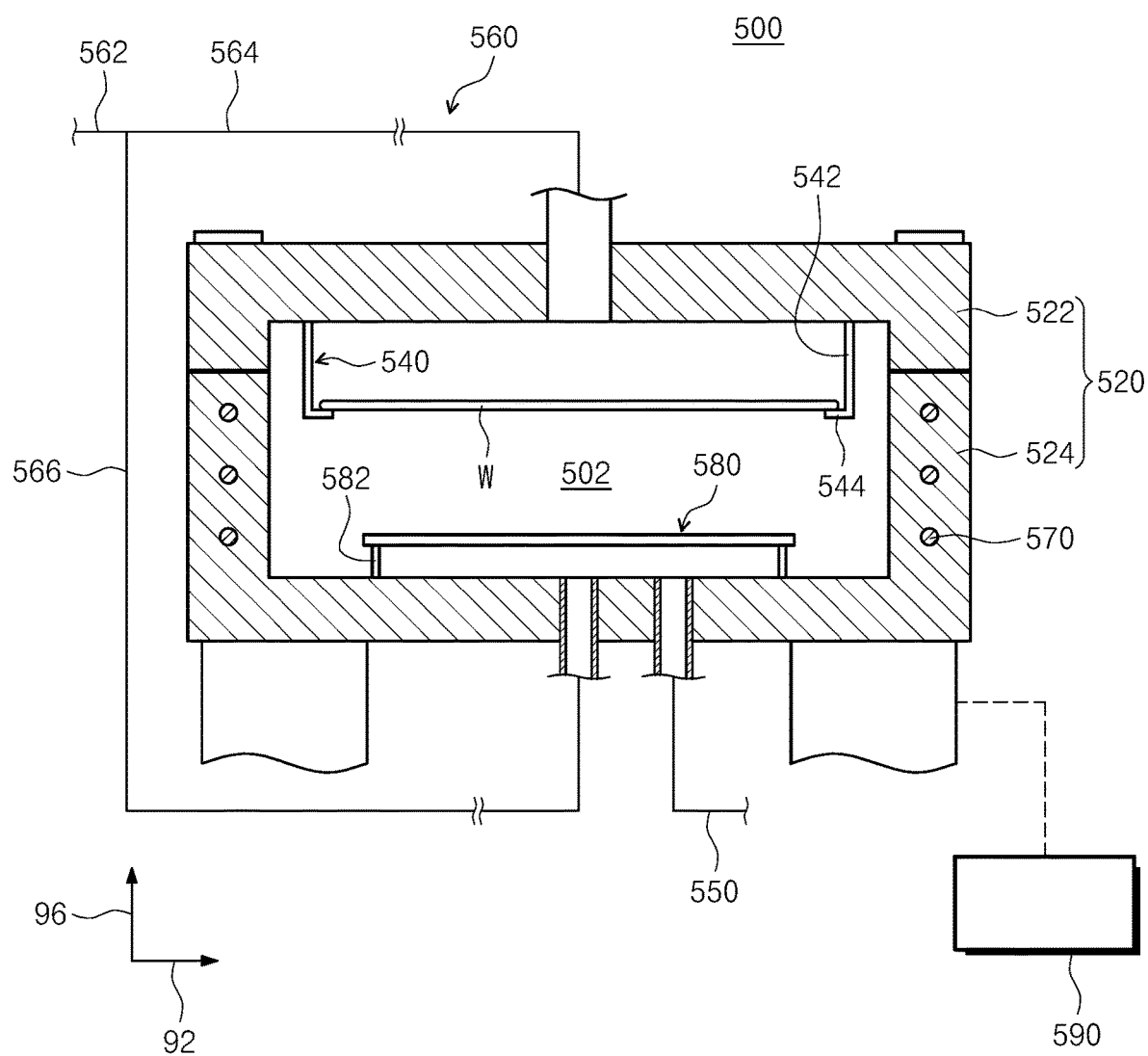
FIG. 3 is a schematic view illustrating a drying chamber of FIG. 1 according to an embodiment of the inventive concept.

FIG. 3 is a schematic view illustrating the drying chamber 500 of FIG. 1 according to an embodiment of the inventive concept. According to an embodiment, the drying chamber 500 may remove a liquid on a substrate W using a supercritical fluid. The drying chamber 500 may have a body 520, a support 540, a fluid supply unit 560, and a blocking plate 580.

The body 520 may have an inner space 502 in which a drying process is performed. The body 520 may have an upper body 522 and a lower body 524. The upper body 522 and the lower body 524 may be combined together to provide the above-described inner space 502. The upper body 522 may be provided above the lower body 524. The upper body 522 may be fixed in one position, and the lower body 524 may be vertically moved by a driving member 590 such as a cylinder. When the lower body 524 is separated from the upper body 522, the inner space 502 may be opened, and the substrate W may be placed in or retrieved from the inner space 502. During the drying process, the lower body 524 may be brought into close contact with the upper body 522, and therefore the inner space 502 may be hermetically sealed from the outside. The drying chamber 500 may have a heater 570. According to an embodiment, the heater 570 may be located in a wall of the body 520. The heater 570 may heat the inner space 502 of the body 520 such that a fluid supplied into the inner space 502 of the body 520 is maintained in a supercritical state.

The support 540 may support the substrate W in the inner space 502 of the body 520. The support 540 may have fixed rods 542 and support parts 544. The fixed rods 542 may be fixedly installed on the upper body 522 to protrude downward from the bottom side of the upper body 522. The longitudinal direction of the fixed rods 542 may be oriented in the vertical direction. The plurality of fixed rods 542 may be spaced apart from each other. The fixed rods 542 may be arranged such that the substrate W does not interfere with the fixed rods 542 when being placed in or retrieved from the space surrounded by the fixed rods 542. The support parts 544 may be coupled to the respective fixed rods 542. The support parts 544 may extend from lower ends of the fixed rods 542 toward the space surrounded by the fixed rods 542. Due to the above-described structure, the edge region of the substrate W placed in the inner space 502 of the body 520 may be placed on the support parts 544, and the entire top side of the substrate W, the central region of the bottom side of the substrate W, and part of the edge region of the bottom side of the substrate W may be exposed to a fluid for drying that is supplied into the inner space 502.

The fluid supply unit 560 may supply the fluid for drying into the inner space 502 of the body 520. According to an embodiment, the fluid for drying may be supplied into the inner space 502 in a supercritical state. Alternatively, the fluid for drying may be supplied into the inner space 502 in a gaseous state and may experience a phase change into a supercritical state in the inner space 502. According to an embodiment, the fluid supply unit 560 may have a main supply line 562, an upper branch line 564, and a lower branch line 566. The upper branch line 564 and the lower branch line 566 may branch from the main supply line 562. The upper branch line 564 may be coupled to the upper body 522 and may supply the fluid for drying from above the substrate W placed on the support 540. According to an embodiment, the upper branch line 564 may be coupled to the center of the upper body 522. The lower branch line 566 may be coupled to the lower body 524 and may supply the fluid for drying from below the substrate W placed on the support 540. According to an embodiment, the lower branch line 566 may be coupled to the center of the lower body 524. An exhaust line 550 may be coupled to the lower body 524. The supercritical fluid in the inner space 502 of the body 520 may be exhausted outside the body 520 through the exhaust line 550.

The blocking plate 580 may be disposed in the inner space 502 of the body 520. The blocking plate 580 may have a circular plate shape. The blocking plate 580 may be supported by support rods 582 so as to be spaced apart upward from the bottom of the body 520. The plurality of support rods 582 may have a rod shape and may be spaced apart from each other by a predetermined distance. When viewed from above, the blocking plate 580 may be superimposed on an outlet of the lower branch line 566 and an inlet of the exhaust line 550. The blocking plate 580 may prevent the fluid for drying, which is supplied through the lower branch line 566, from being directly sprayed toward the substrate W to damage the substrate W.

The controller (not shown) may control the transfer robot 320, the liquid processing chambers 400, and the drying chambers 500 to process substrates W by a preset substrate processing method. Hereinafter, an example of the substrate processing method will be described.

Figure 4:
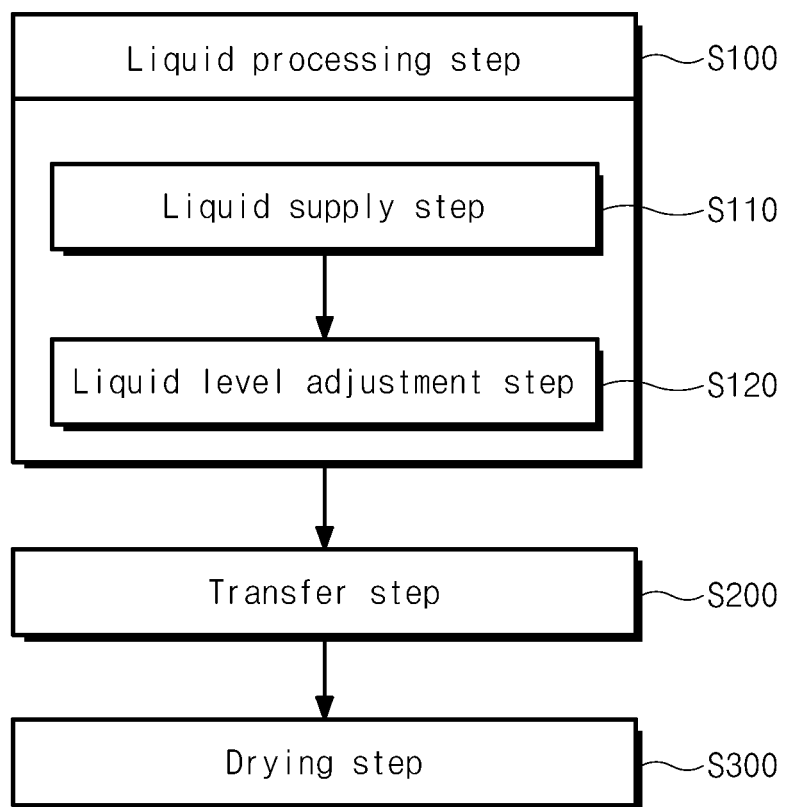
FIG. 4 is a flowchart illustrating a substrate processing method according to an embodiment of the inventive concept.

FIG. 4 is a flowchart illustrating a substrate processing method according to an embodiment of the inventive concept. Referring to FIG. 4, the substrate processing method may comprise liquid processing step S100, transfer step S200, and drying step S300.

Liquid processing step S100 may be performed in the liquid processing chamber 400. In liquid processing step S100, liquids may be supplied onto a substrate W to process the substrate W. According to an embodiment, in liquid processing step S100, a first liquid, a second liquid, and a third liquid may be sequentially supplied onto the substrate W to process the substrate W. The first liquid may be a chemical containing an acid or alkali, such as a sulfuric acid, a nitric acid, a hydrochloric acid, or the like. The second liquid may be pure water, and the third liquid may be isopropyl alcohol. First, the chemical may be supplied onto the substrate W to remove a thin film or foreign matter remaining on the substrate W. Next, the pure water may be supplied onto the substrate W, and the chemical on the substrate W may be replaced with the pure water. Then, the isopropyl alcohol may be supplied onto the substrate W, and the pure water on the substrate W may be replaced with the isopropyl alcohol. Since the pure water dissolves better in the isopropyl alcohol than the chemical, the pure water may be easy to replace. Furthermore, the surface of the substrate W may be neutralized by the pure water. Since the isopropyl alcohol dissolves well in carbon dioxide used in the drying chamber 500, the isopropyl alcohol may be easily removed by the carbon dioxide in a supercritical state in the drying chamber 500.

Transfer step S200 may be performed by the transfer robot 320. After the liquid processing is completed in the liquid processing chamber 400, transfer step S200 of transferring the substrate W into the drying chamber 500 from the liquid processing chamber 400 may be performed. While the substrate W is being transferred by the transfer robot 320, a liquid may remain on the substrate W. Hereinafter, the liquid remaining on the substrate W during the transfer of the substrate W by the transfer robot 320 may be referred to as the processing liquid. In the above-described embodiment, the processing liquid may be, for example, the third liquid.

Drying step S300 may be performed in the drying chamber 500. The substrate W transferred into the drying chamber 500 may be supported by the support 540, with the edge region of the substrate W placed on the support parts 544. Carbon dioxide may be supplied into the inner space 502 of the body 520 through the lower branch line 566. When the pressure inside the inner space 502 of the body 520 reaches a set pressure, carbon dioxide may be supplied into the inner space 502 of the body 520 through the upper branch line 564. Alternatively, when the pressure inside the inner space 502 of the body 520 reaches the set pressure, carbon dioxide may be simultaneously supplied into the inner space 502 of the body 520 through the upper branch line 564 and the lower branch line 566. During the process, the carbon dioxide may be periodically supplied into or discharged from the inner space 502 of the body 520 a plurality of times. When a predetermined amount of the processing liquid remaining on the substrate W is dissolved in the supercritical carbon dioxide by the above-described method, the carbon dioxide may be discharged from the inner space 502, and new carbon dioxide may be supplied into the inner space 502, thereby improving the rate of removal of the processing liquid from the substrate W.

Next, a process of processing the substrate W with the processing liquid in the liquid processing chamber 400 will be described in detail. In an embodiment described below, the processing liquid may be an organic solvent such as isopropyl alcohol.

When liquid processing step S100 is completed in the liquid processing chamber 400, the height of the processing liquid remaining on the edge region of the substrate W may be higher than the height of the processing liquid remaining on the central region of the substrate W. According to an embodiment, liquid processing step S100 may comprise liquid supply step S110 and liquid level adjustment step S120.

Figure 5:
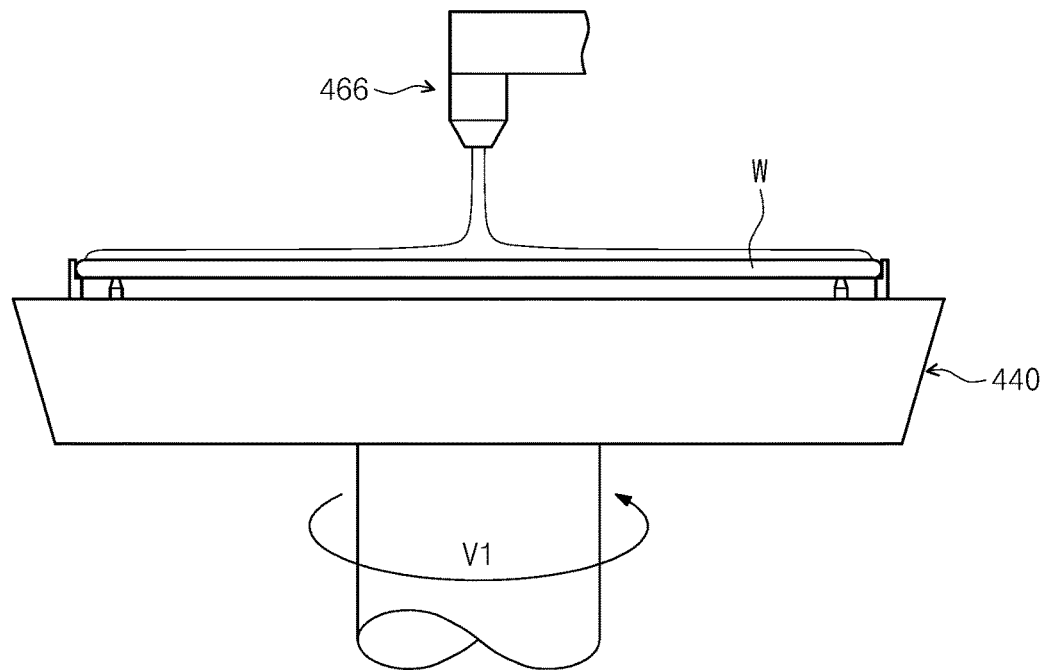
FIGS. 5 and 6 are views illustrating processing of a substrate in a liquid supply step and a liquid level adjustment step, respectively.
Figure 6:
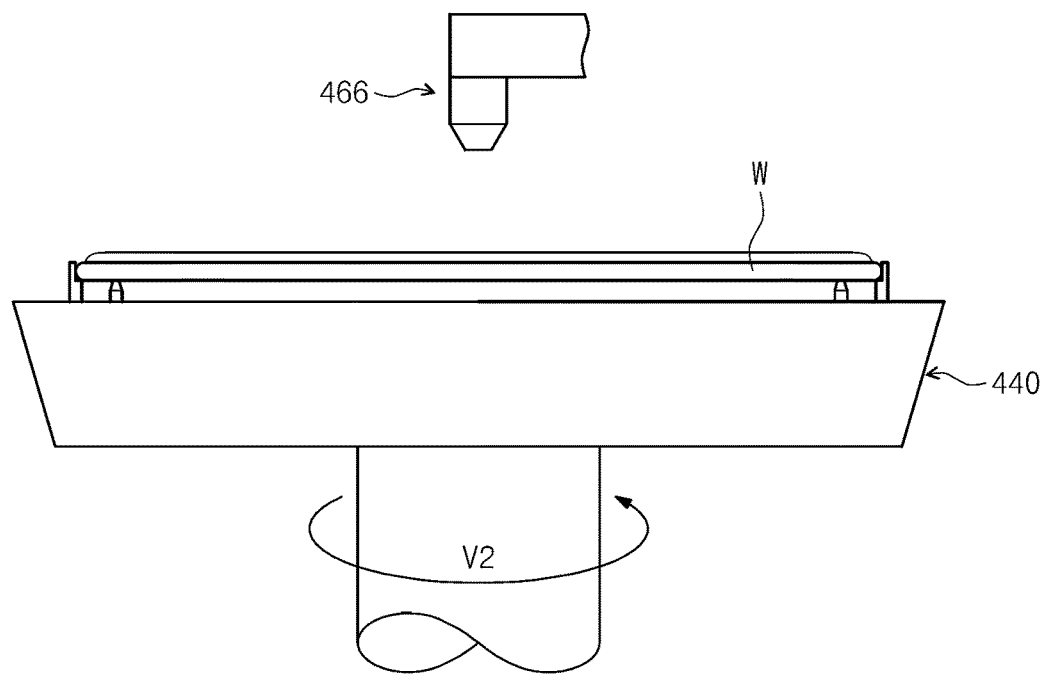

FIGS. 5 and 6 are views illustrating processing of the substrate W in liquid supply step S110 and liquid level adjustment step S120, respectively.

Referring to FIG. 5, in liquid supply step S110, the processing liquid may be supplied onto the substrate W. In liquid supply step S110, the substrate W may be rotated at a first speed of V1. The processing liquid may be supplied onto the central region of the substrate W. For example, the processing liquid may be supplied toward the center of the substrate W.

In liquid level adjustment step S120, the thickness of the processing liquid supplied onto the substrate W may be adjusted. According to an embodiment, in liquid level adjustment step S120, the thickness of the processing liquid may be adjusted to vary depending on regions on the substrate W. For example, the thickness of the processing liquid may be adjusted such that the thickness of the processing liquid on the edge region of the substrate W is greater than the thickness of the processing liquid on the central region of the substrate W. Referring to FIG. 6, in liquid level adjustment step S120, the supply of the processing liquid onto the substrate W may be stopped, and the substrate W may be rotated at a second speed of V2. The thickness of the processing liquid may be adjusted by controlling the second speed V2.

Figure 7:
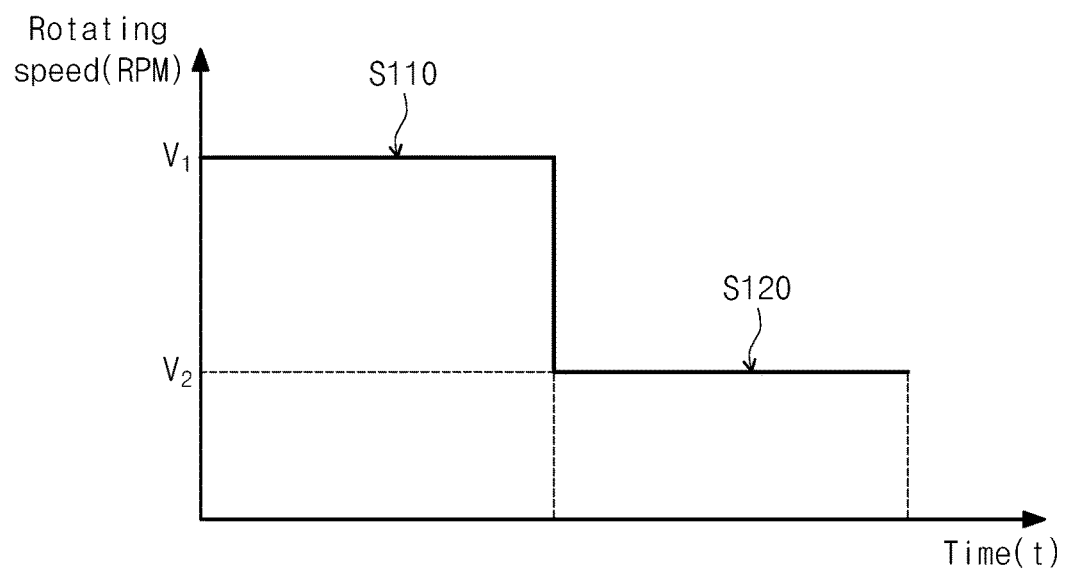
FIG. 7 is a view illustrating an example of a rotating speed of the substrate in the liquid supply step.

FIG. 7 is a view illustrating an example of a rotating speed of the substrate W in liquid supply step S110. Referring to FIG. 7, the second speed V2 in liquid level adjustment step S120 may be lower than the first speed V1 in liquid supply step S110. The second speed V2 appropriate for the thicknesses of the processing liquid that are required for the edge region and the central region of the substrate W may be determined by conducting a test by modifying the RPM of the substrate W in liquid level adjustment step S120. According to an embodiment, the first speed V1 in liquid supply step S110 may be 200 RPM or more, and the second speed V2 in liquid level adjustment step S120 may range from 10 RPM to 100 RPM. When liquid level adjustment step S120 is completed, the rotation of the substrate W may be stopped.

Figure 8:
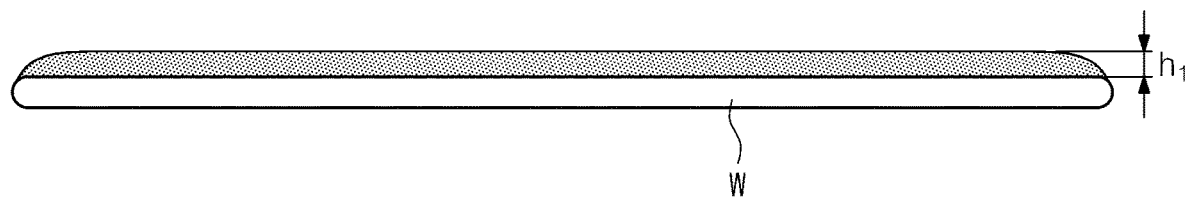
FIGS. 8 to 11 are views illustrating a variation in the height of a processing liquid on a substrate in a liquid supply step, a liquid level adjustment step, a transfer step, and a drying step, respectively.
Figure 9:
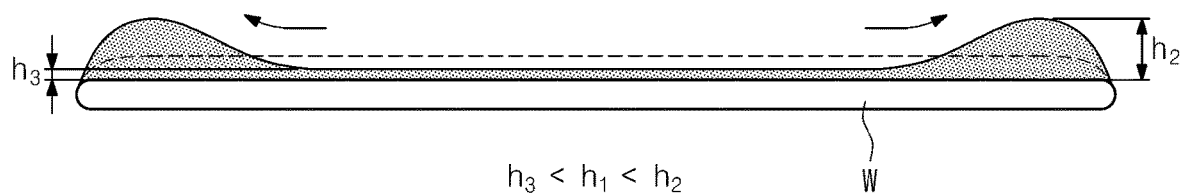
Figure 10:
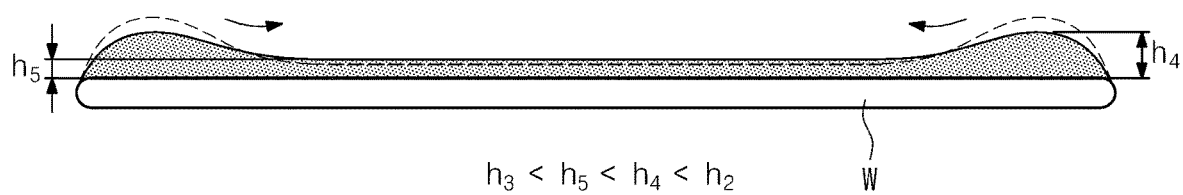

Hereinafter, a variation in the height of the processing liquid on the substrate W in liquid supply step S110, liquid level adjustment step S120, transfer step S200, and drying step S300 will be described with reference to FIGS. 8 to 11. FIG. 8 is a view illustrating an example of the thickness of the processing liquid on the substrate W when liquid supply step S110 is completed, and FIG. 9 is a view illustrating an example of the thickness of the processing liquid on the substrate W when liquid level adjustment step S120 is completed. FIG. 10 is a view illustrating an example of the thickness of the processing liquid on the substrate W when the substrate W is transferred into the drying chamber 500, and FIG. 11 is a view illustrating an example of the thickness of the processing liquid on the substrate W when the substrate W is placed on the support 540 of the drying chamber 500.

When liquid supply step S110 is completed in FIG. 7, the thickness h1 of the processing liquid on the entire region of the substrate W may be substantially uniform as illustrated in FIG. 8, or the thickness of the processing liquid on the central region of the substrate W may be slightly greater than the thickness of the processing liquid on the edge region of the substrate W. Thereafter, when the substrate W is rotated at a relatively low speed in liquid level adjustment step S120, the processing liquid supplied onto the substrate W may remain in a large amount on the edge region of the substrate W without being separated from the substrate W by a centrifugal force. Accordingly, as illustrated in FIG. 9, the height h2 of the processing liquid on the edge region of the substrate W may be higher than the height h3 of the processing liquid on the central region of the substrate W.

While the substrate W is being transferred by the transfer robot 320, part of the processing liquid remaining on the edge region of the substrate W, as illustrated in FIG. 10, may flow toward the central region of the substrate W due to a restoring force or surface tension. Therefore, immediately after the substrate W is transferred into the drying chamber 500, the difference in the height of the processing liquid between the edge region and the central region of the substrate W may be smaller than that in FIG. 9 although the height h4 of the processing liquid on the edge region of the substrate W is maintained to be greater than the height h5 of the processing liquid on the central region of the substrate W.

Figure 11:
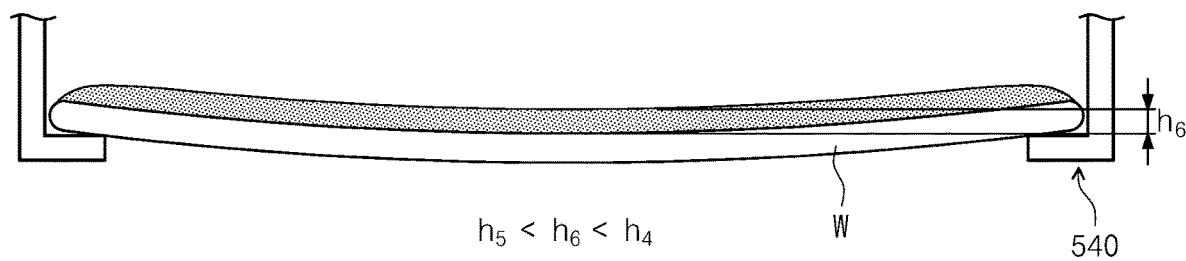

Thereafter, when the substrate W is placed on the support 540 of the drying chamber 500, the substrate W, as illustrated in FIG. 11, may sag in the middle, and part of the processing fluid on the edge region of the substrate W may flow to the central region of the substrate W. Furthermore, since the edge region of the substrate W is placed on the heated support parts 544, part of the processing liquid on the edge region of the substrate W may evaporate. Due to this, the height h6 of the processing liquid on the edge region of the substrate W may be maintained to be equal to the height of the processing liquid on the central region of the substrate W, or the difference in the height of the processing liquid between the edge region and the central region of the substrate W may be smaller than that in FIG. 9 or 10.

According to an embodiment of the inventive concept, since liquid level adjustment step S120 of rotating the substrate W for a predetermined period of time in the state in which the supply of the processing liquid is stopped is performed after the completion of liquid supply step S110, the thickness of the processing liquid on the edge region of the substrate W may be made greater than the thickness of the processing liquid on the central region of the substrate W. Due to this, when the substrate W is transferred into the drying chamber 500, the thickness of the processing liquid on the edge region of the substrate W may be greater than the thickness of the processing liquid on the central region of the substrate W. Although the substrate W, when transferred into the drying chamber 500 and placed on the support parts 544, sags in the middle so that part of the processing liquid on the edge region of the substrate W flows toward the central region thereof, the processing liquid of a predetermined height may remain on the edge region of the substrate W. Accordingly, the edge region of the substrate W may be prevented from being naturally dried. Furthermore, when the substrate W is placed on the support parts 544 in the drying chamber 500, the difference in the height of the processing liquid between the edge region and the central region of the substrate W may be reduced so that the entire region of the substrate W may be uniformly dried by a supercritical fluid.

Next, various modified examples of supplying a processing liquid onto a substrate in the liquid processing chamber 400 will be described with reference to FIGS. 12 to 15.

Figure 12:
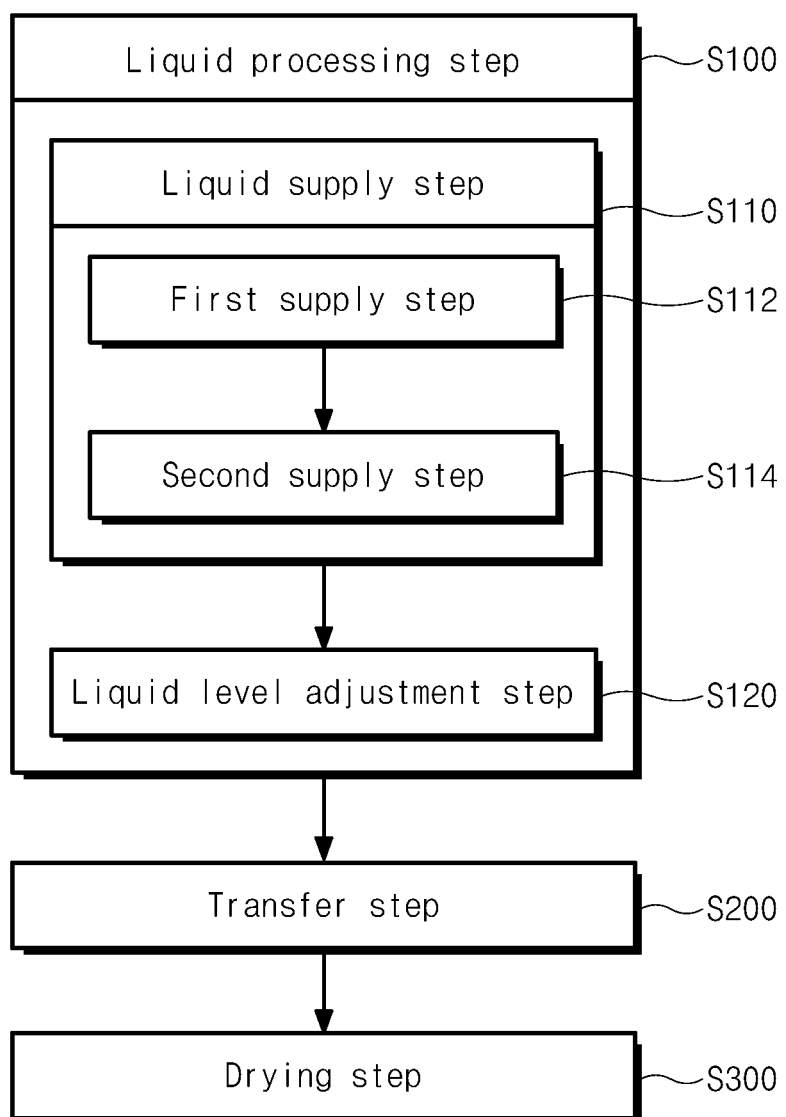
FIGS. 12 to 15 are views illustrating various modified examples of supplying a processing liquid onto a substrate in the liquid processing chamber.

FIG. 12 is a flowchart illustrating a substrate processing method according to an embodiment of the inventive concept. Referring to FIG. 12, a step of supplying a processing liquid onto a substrate W may comprise liquid supply step S110, transfer step S200, and drying step S300 as in the embodiment of FIG. 4. However, liquid supply step S110 in the embodiment of the inventive concept may comprise first supply step S112 and second supply step S114. In first and second supply steps S112 and S114, the processing liquid may be supplied onto the central region of the substrate W. For example, the processing liquid may be supplied to the center of the substrate W. In first supply step S112, the substrate W may be rotated at a first rotating speed of V11, and the processing liquid may be supplied onto the substrate W at a first flow rate of Q11. In second supply step S114, the substrate W may be rotated at a second rotating speed, and the processing liquid may be supplied onto the substrate W at a second flow rate. The first rotating speed may be higher than the second rotating speed. Furthermore, the first flow rate may be greater than the second flow rate. In addition, the first rotating speed may be higher than the second rotating speed, and the first flow rate may be greater than the second flow rate. Both the first rotating speed and the second rotating speed may be higher than a second speed in liquid level adjustment step S120.

Figure 13:
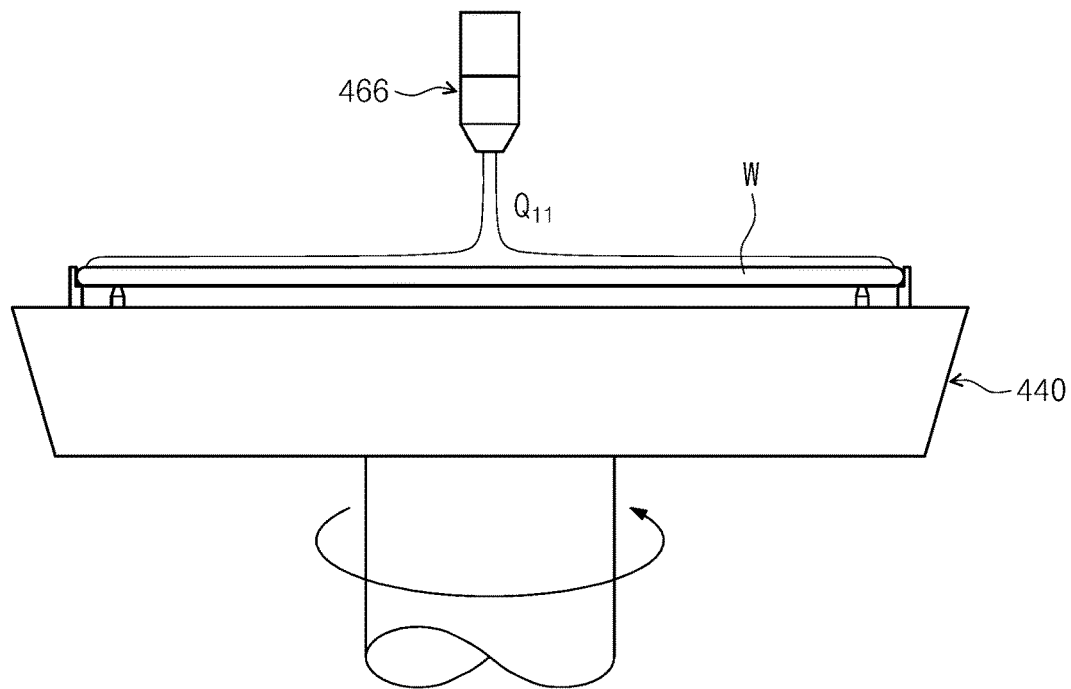
Figure 14:
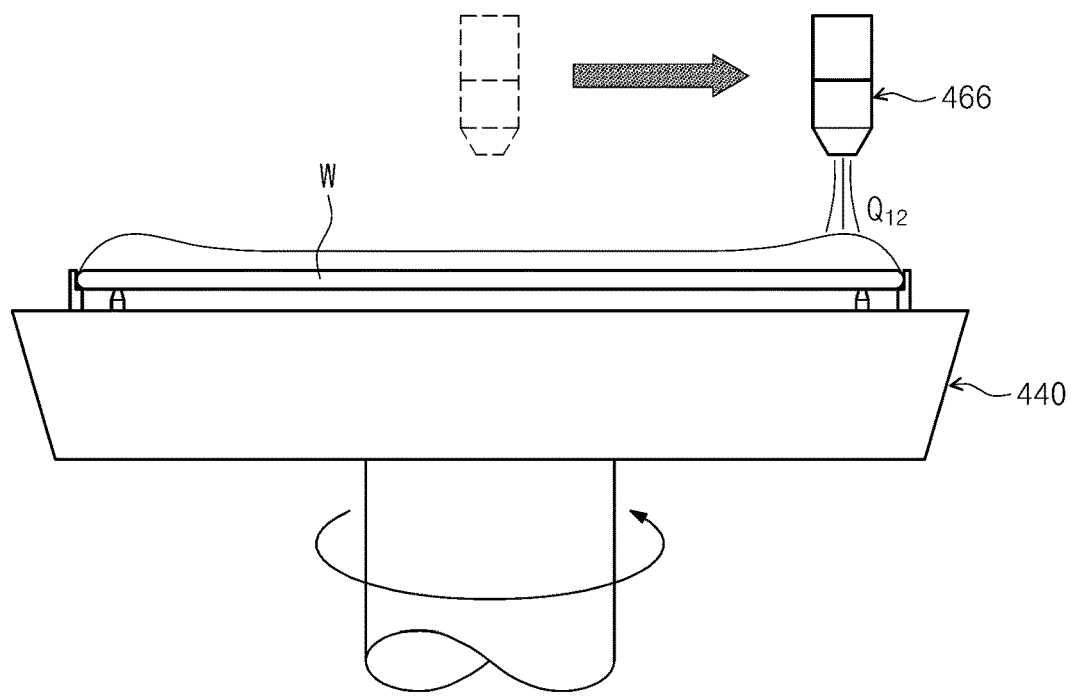

FIGS. 13 and 14 are schematic views illustrating another example of the substrate processing method. FIG. 13 illustrates a first supply step, and FIG. 14 illustrates a second supply step. Referring to FIGS. 13 and 14, a step of performing liquid processing on a substrate W by using a processing liquid may comprise a liquid supply step. In the liquid supply step, the substrate W may be rotated, and the processing liquid may be supplied onto the substrate W. The liquid supply step may comprise the first supply step and the second supply step. The first supply step and the second supply step may be sequentially performed. Referring to FIG. 13, in the first supply step, the processing liquid may be supplied onto the central region of the substrate W. According to an embodiment, the processing liquid may be supplied to the center of the substrate W. In the first supply step, the processing liquid may be supplied at a first flow rate of Q11. Referring to FIG. 14, in the second supply step, the processing liquid may be supplied onto the edge region of the substrate W. In the second supply step, the processing liquid may be supplied at a second flow rate of Q12. According to an embodiment, the first flow rate Q11 may be less than the second flow rate Q12. The rotating speed of the substrate W in the first supply step may differ from the rotating speed of the substrate W in the second supply step. For example, the rotating speed of the substrate W in the second supply step may be lower than the rotating speed of the substrate W in the first supply step.

According to an embodiment, during the supply of the processing fluid, the third nozzle 466 may be moved to modify the location where the processing liquid is supplied onto the substrate W. The location where the processing liquid is supplied may be continuously shifted from the center of the substrate W to an end portion thereof. Alternatively, the location where the processing liquid is supplied may be fixed in a specific position of the central region of the substrate W and may then be fixed in a specific position of the edge region of the substrate W. When the substrate W is completely processed with the processing liquid by the above-described method, the thickness of the processing liquid on the edge region of the substrate W may be maintained to be greater than the thickness of the processing liquid on the central region of the substrate W. The flow rates of the processing fluid supplied onto the central region and the edge region of the substrate W may be determined to be appropriate for the thicknesses of the processing liquid that are required for the central region and the edge region of the substrate W, by conducting a test by modifying the flow rate of the processing liquid in each region.

Figure 15:
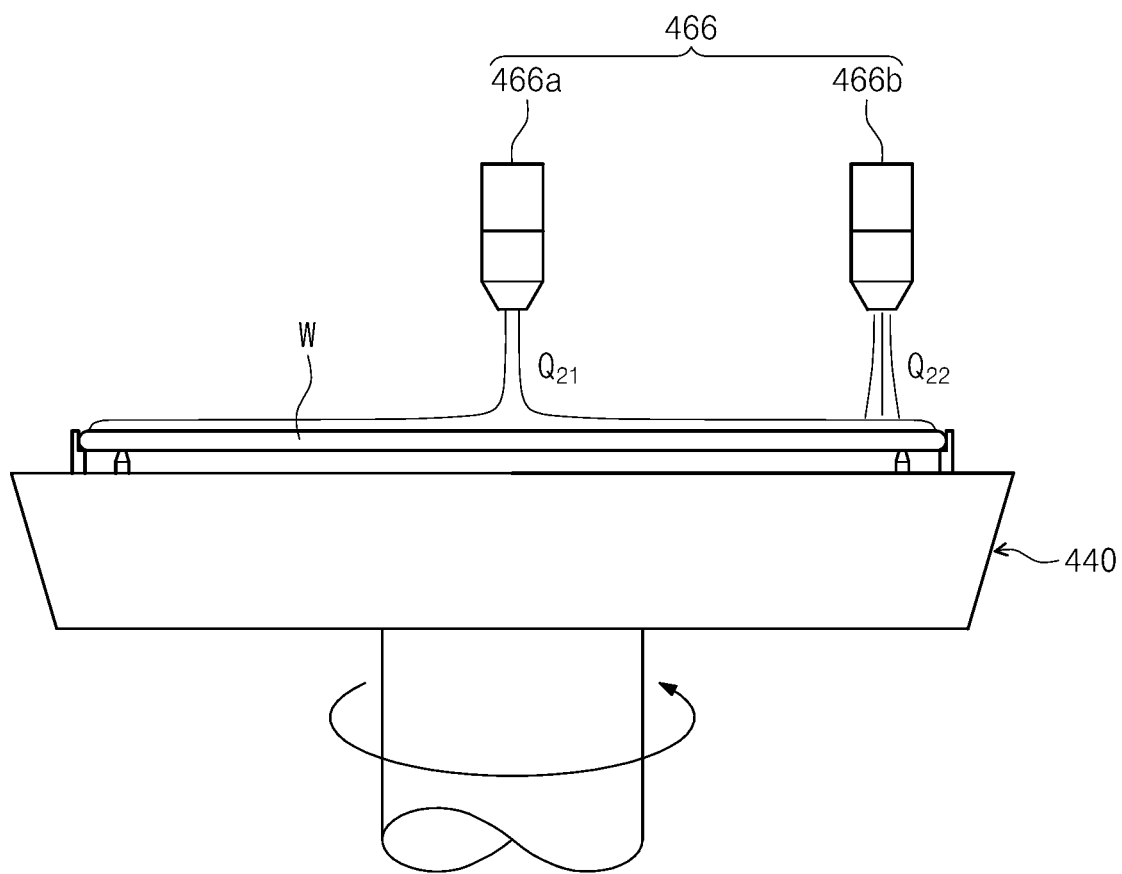

FIG. 15 is a schematic view illustrating another example of the substrate processing method. Referring to FIG. 15, the third nozzle 466 for supplying a processing liquid onto a substrate W may comprise a central nozzle 466a and an edge nozzle 466b. The central nozzle 466a may supply the processing liquid onto the central region of the substrate W, and the edge nozzle 466b may supply the processing liquid onto the edge region of the substrate W. The central nozzle 466a and the edge nozzle 466b may be mounted on the arm 461 and may be operated together. Alternatively, the central nozzle 466a and the edge nozzle 466b may be mounted on different arms 461 and may be separately operated. Referring to FIG. 15, a step of performing liquid processing on the substrate W by using the processing liquid may comprise a liquid supply step. In the liquid supply step, the substrate W may be rotated, and the processing liquid may be supplied onto the substrate W. In the liquid supply step, the processing liquid may be simultaneously supplied onto the substrate W through the central nozzle 466a and the edge nozzle 466b. The flow rate Q22 of the processing liquid supplied by the edge nozzle 466b may be greater than the flow rate Q21 of the processing liquid supplied by the central nozzle 466a. When the substrate W is completely processed with the processing liquid by the above-described method, the thickness of the processing liquid on the edge region of the substrate W may be maintained to be greater than the thickness of the processing liquid on the central region of the substrate W. The flow rates of the processing fluid supplied onto the central region and the edge region of the substrate W may be determined to be appropriate for the thicknesses of the processing liquid that are required for the central region and the edge region of the substrate W, by conducting a test by modifying the flow rates of the processing liquid supplied by the central nozzle 466a and the edge nozzle 466b.

In the embodiment of FIGS. 13 and 14 and the embodiment of FIG. 15, the thicknesses of the processing liquid on the central region and the edge region of the substrate W may be adjusted by only the liquid supply step without a step of stopping the supply of the processing liquid. In the embodiment of FIGS. 13 and 14 and the embodiment of FIG. 15, a step of stopping the supply of the processing liquid and rotating the substrate W may be additionally performed after the liquid supply step.

According to another embodiment of the inventive concept, a substrate processing method may comprise liquid processing process S500, liquid level adjustment process S600, and a drying process.

In liquid processing process S500, liquids may be supplied onto a substrate W to process the substrate W. According to an embodiment, in liquid processing process S500, a first liquid, a second liquid, and a third liquid may be sequentially supplied onto the rotating substrate W to process the substrate W. The first to third liquids may be the same type as those in the above-described embodiments. In the embodiment of the inventive concept, the third liquid may be a liquid that is last supplied onto the substrate W in liquid processing process S500, and a processing liquid may correspond to the third liquid.

Liquid level adjustment process S600 may be performed after liquid processing process S500 is completed. In liquid level adjustment process S600, the level of the processing liquid remaining on the substrate W may be adjusted. In liquid level adjustment process S600, the substrate W may be rotated in the state in which the supply of the processing liquid onto the substrate W is stopped. In liquid level adjustment process S600, the level of the processing liquid remaining on the substrate W may be adjusted by controlling the rotating speed of the substrate W.

Figure 16:
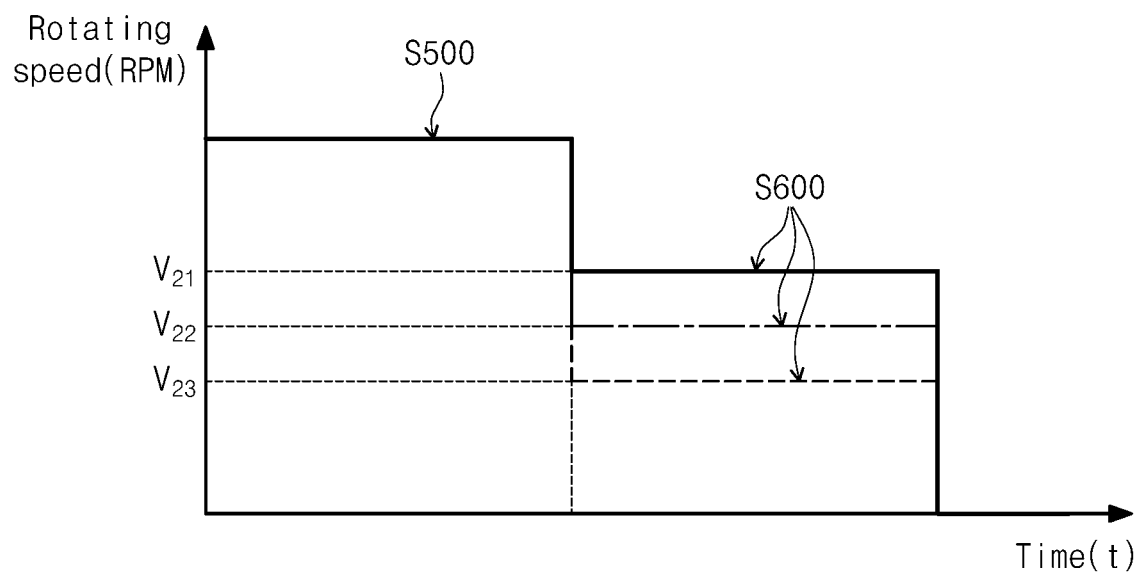
FIG. 16 is a view illustrating a correlation between a rotating speed of a substrate in a liquid level adjustment process and the weight of a processing liquid remaining on the substrate after adjustment of a liquid level.
Figure 17:
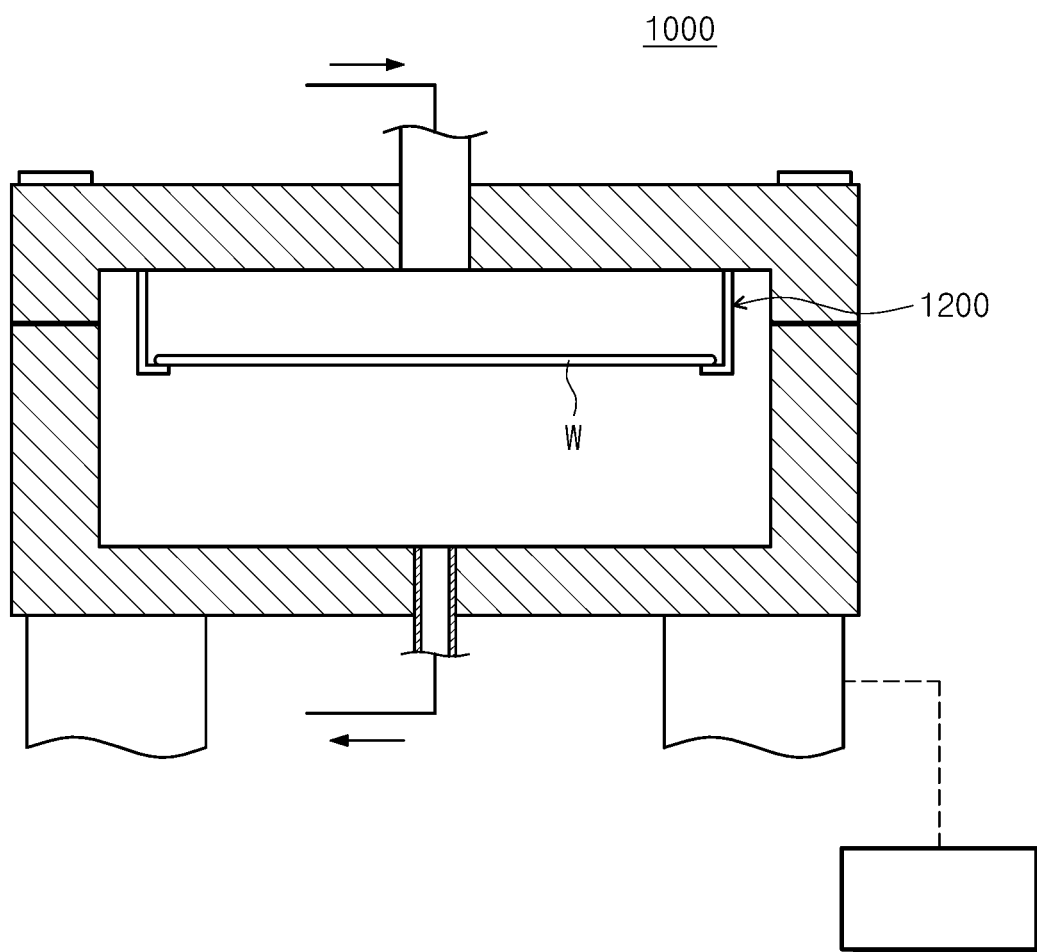
FIG. 17 is a view illustrating a general drying chamber for drying a substrate using a supercritical fluid.
Figure 18:
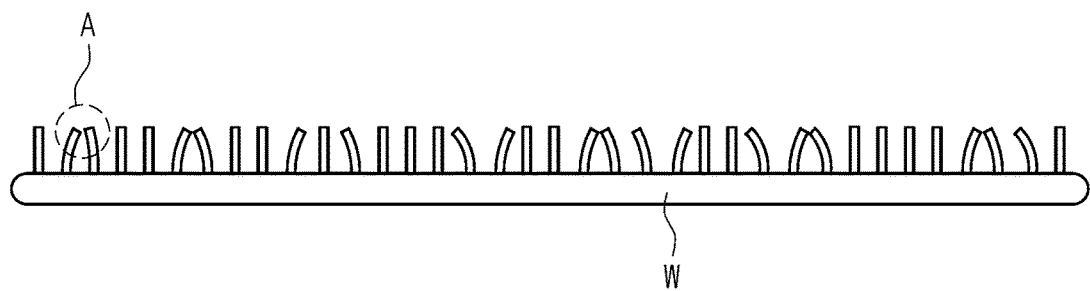
FIG. 18 is a view illustrating a leaning phenomenon that arises on a substrate during natural drying.
Figure 19:
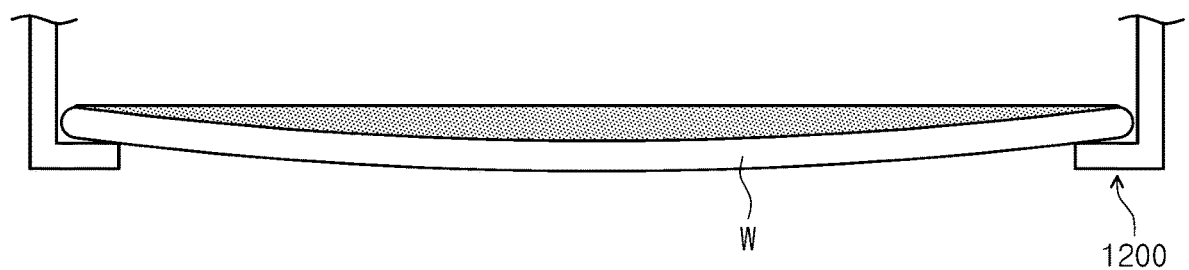
FIG. 19 is a view illustrating a state of a processing liquid on a substrate when a drying process is performed in the apparatus of FIG. 17.

FIG. 16 is a view illustrating a correlation between the rotating speed of the substrate W in the liquid level adjustment process and the weight of the processing liquid remaining on the substrate W after the adjustment of the liquid level. Referring to FIG. 16, the weight of the processing liquid on the substrate W was measured by changing the rotating speed of the substrate W to V21, V22, and V23 in liquid level adjustment process S600, and the weight of the processing liquid on the substrate W was measured to be a, b, and c. The rotating speed of the substrate W was reduced in the order of V21, V22, and V23, and the measured weight of the processing liquid was increased in the order a, b, and c.

According to the embodiment of the inventive concept, the rotating speed of the substrate W in liquid level adjustment process S600 may be set to a first set speed in the case where the level of the processing liquid remaining on the substrate W before the drying process is set to a first level, and may be set to a second set speed in the case where the level of the processing liquid remaining on the substrate W before the drying process is set to a second level. When the first level is higher than the second level, the first set speed may be lower than the second set speed. The rotating speed of the substrate W may be determined such that the level of the processing liquid remaining on the substrate W after liquid processing process S500 reaches a preset level, by conducting a test by changing the RPM of the substrate W in liquid level adjustment process S600.

The drying process may be performed after liquid level adjustment process S600 is completed. In the drying process, the processing liquid remaining on the substrate W may be removed.

According to the embodiment of the inventive concept, liquid processing process S500 may be performed in the liquid processing chamber 400 of FIG. 1, and the drying process may be performed in the drying chamber 500. The liquid processing chamber 400 and the drying chamber 500 may be provided in the same manner as described above with regard to the embodiments, and the substrate W on which liquid processing process S500 is completely performed in the liquid processing chamber 400 may be transferred into the drying chamber 500 by the transfer robot 320. In the embodiment of the inventive concept, the drying chamber 500 may have a structure that supports the entire bottom side of the substrate W. Alternatively, the drying chamber 500 may support only the central region of the substrate W. In another case, the drying chamber 500 may support the substrate W in various ways. A fluid for drying that is used in the drying chamber 500 may be the same as those in the above-described embodiments.

While the inventive concept has been described with reference to embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A method for processing a substrate, the method comprising:
    a liquid processing step for performing liquid processing on the substrate by supplying a processing liquid onto the substrate;
    a drying step for drying the substrate after the liquid processing step; and
    a transfer step for transferring the substrate from a liquid processing chamber to a drying chamber after the liquid processing step,
    wherein the liquid processing step is performed in the liquid processing chamber and the drying step is performed in the drying chamber,
    wherein the liquid processing step comprises:
    a liquid supply step for supplying the processing liquid toward the substrate; and
    a liquid level adjustment step for rotating the substrate after the liquid supply step,
    wherein the substrate is rotated at a first speed in the liquid supply step and at a second speed in the liquid level adjustment step, and the second speed is different from the first speed,
    wherein the liquid supply step comprises:
    a first supply step for rotating the substrate and supplying the processing liquid toward a central region of the substrate; and
    a second supply step for rotating the substrate and supplying the processing liquid onto an edge region of the substrate after the first supply step,
    wherein the first supply step, the processing liquid is supplied by a nozzle from above the central region of the substrate, and
    wherein the second supply step, the processing liquid is supplied by the nozzle from above the edge region of the substrate,
    wherein the substrate is transferred from the liquid processing chamber to the drying chamber, such that in the transfer step, a height of the processing liquid on two edge regions of the substrate are both higher than a height of the processing liquid on the central region of the substrate, wherein the two edge regions are on opposite sides of the central region.

2. The method of claim 1,
    wherein the substrate is transferred from the liquid processing chamber to the drying chamber right after the liquid level adjustment step.

3. The method of claim 1, wherein the processing liquid comprises an organic solvent.

4. The method of claim 1, wherein in the drying step, the substrate is dried using a supercritical fluid.

5. The method of claim 1, wherein in the drying step, the substrate is dried while the edge region of the substrate excluding the central region of the substrate is supported by a support unit.

6. The method of claim 1, wherein the first supply step, the processing liquid is supplied at a first flow rate, and wherein the second supply step, the processing liquid is supplied at a second flow rate, wherein the first flow rate is less than the second flow rate.

7. The method of claim 2, wherein supplying the process liquid is stopped in the liquid level adjustment step.

* * * * *